US012795842B2

(12) United States Patent
Larsen et al.

(10) Patent No.: US 12,795,842 B2
(45) Date of Patent: Nov. 10, 2026

(54) GROUNDING ARCHITECTURE FOR ENHANCED ANTENNA DESENSITIZATION

(71) Applicant: Google LLC, Mountain View, CA (US)

(72) Inventors: Niels Bonne Larsen, Moss Beach, CA (US); George Mankaruse, Woodridge, IL (US); Adrian Gheorghe Manea, Libertyville, IL (US); Charles Victor Wiseman, III, Chicago, IL (US)

(73) Assignee: Google LLC, Mountain View, CA (US)

( * ) Notice: Subject to any disclaimer, the term of this patent is extended or adjusted under 35 U.S.C. 154(b) by 284 days.

(21) Appl. No.: 18/808,305

(22) Filed: Aug. 19, 2024

(65) Prior Publication Data

US 2024/0414860 A1 Dec. 12, 2024

Related U.S. Application Data

(60) Provisional application No. 63/682,540, filed on Aug. 13, 2024.

(51) Int. Cl.
*H05K 5/02* (2006.01)
*H05K 5/03* (2006.01)

(52) U.S. Cl.
CPC ......... *H05K 5/0217* (2013.01); *H05K 5/0247* (2013.01); *H05K 5/03* (2013.01)

(58) Field of Classification Search
CPC ...... H05K 5/0217; H05K 5/0247; H05K 5/03; H04M 1/0266; G06F 1/1637
See application file for complete search history.

(56) References Cited

U.S. PATENT DOCUMENTS

2016/0044801 A1* 2/2016 Lee ........................ G06F 1/1637 361/679.55
2021/0333842 A1* 10/2021 Fabrega Sanchez . G06F 1/1626

* cited by examiner

*Primary Examiner* — Ayodeji O Ayotunde
(74) *Attorney, Agent, or Firm* — Colby Nipper PLLC

(57) ABSTRACT

This document describes systems and apparatuses for a grounding architecture within an electronic device directed at improving isolation for enhanced antenna desensitization. In aspects, an electronic device includes a grounding architecture positioned at least partially within an internal cavity of a housing. The grounding architecture includes a first insulating layer, a first copper tape layer, a second insulating layer, a second copper tape layer, and a metal trim layer. In such a configuration, isolation within the electronic device can be improved and antenna sensitivity degradation can be reduced.

11 Claims, 5 Drawing Sheets

GROUNDING ARCHITECTURE FOR ENHANCED ANTENNA DESENSITIZATION

CROSS-REFERENCE TO RELATED APPLICATION(S)

This application claims the benefit of U.S. Provisional Patent Application Ser. No. 63/682,540, filed on Aug. 13, 2024, the disclosure of which is incorporated by reference herein in its entirety.

SUMMARY

This document describes techniques, systems, and apparatuses for a grounding architecture within an electronic device directed at improving isolation for enhanced antenna desensitization. In aspects, an electronic device includes a grounding architecture positioned at least partially within an internal cavity of a housing. The grounding architecture includes a first insulating layer, a first copper tape layer, a second insulating layer, a second copper tape layer, and a metal trim layer. In such a configuration, isolation within the electronic device can be improved and antenna sensitivity degradation can be reduced.

In aspects, an electronic device is disclosed that includes a housing and an attached display configured to define an internal cavity within which one or more electronic components are disposed. The display includes a cover glass having an exterior face and an opposing interior face and a display panel module having a first surface and an opposing second surface, the first surface of the display panel module attached to the interior face of the cover glass. The electronic device further includes a first antenna and a second antenna disposed at least partially within the internal cavity. The first antenna and the second antenna are disposed adjacent to a plurality of grounding elements effective to configure an isolated grounding path. The electronic device further includes a grounding architecture positioned within the internal cavity. The grounding architecture includes a first insulating layer attached to the second surface of the display panel module, a first copper tape layer attached to the first insulating layer, a second insulating layer attached to the first copper tape layer, a second copper tape layer attached to the second insulating layer, and a metal trim layer attached to the second copper tape layer. The metal trim layer is configured to be electrically coupled to at least one of the plurality of grounding elements.

This Summary is provided to introduce simplified concepts for a grounding architecture within an electronic device directed at improving isolation for enhanced antenna desensitization, which is further described below in the Detailed Description and is illustrated in the Drawings. This Summary is intended neither to identify essential features of the claimed subject matter nor for use in determining the scope of the claimed subject matter.

BRIEF DESCRIPTION OF THE DRAWINGS

The details of one or more aspects of a grounding architecture within an electronic device directed at improving isolation for enhanced antenna desensitization are described in this document with reference to the following drawings. The use of the same numbers in different instances may indicate similar features or components.

DETAILED DESCRIPTION

Overview

This document describes a grounding architecture within an electronic device directed at improving isolation for enhanced antenna desensitization. Many electronic devices include displays, including, for example, light-emitting diode (LED) displays or liquid crystal displays (LCDs). Electronic device manufacturers often fabricate displays in a layered structure. The layered structure includes a display module having a display panel ("display flex") that, when integrated into an electronic device, is disposed underneath a cover glass.

Users of electronic devices often desire a strong antenna signal and reliable signal systems within their electronic devices. In some instances, cavities within the display of an electronic device may cause a resonance and may prevent energy that would otherwise be radiated from the antenna, which can negatively impact antenna performance and system reliability. To this end, this document describes systems and apparatuses for a grounding architecture within an electronic device directed at improving isolation for enhanced antenna desensitization. In aspects, an electronic device includes a grounding architecture positioned at least partially within an internal cavity of a housing. The grounding architecture includes a first insulating layer, a first copper tape layer, a second insulating layer, a second copper tape layer, and a metal trim layer. In such a configuration, isolation within the electronic device can be improved and antenna sensitivity degradation can be reduced.

Features and concepts of the described techniques for a grounding architecture within an electronic device directed at improving isolation for enhanced antenna desensitization can be implemented in any of a variety of different electronic devices. Examples described herein include, but are not limited to, smartphones, tablets, laptops, monitors, video game consoles, and so forth.

Example Device

Figure 1:
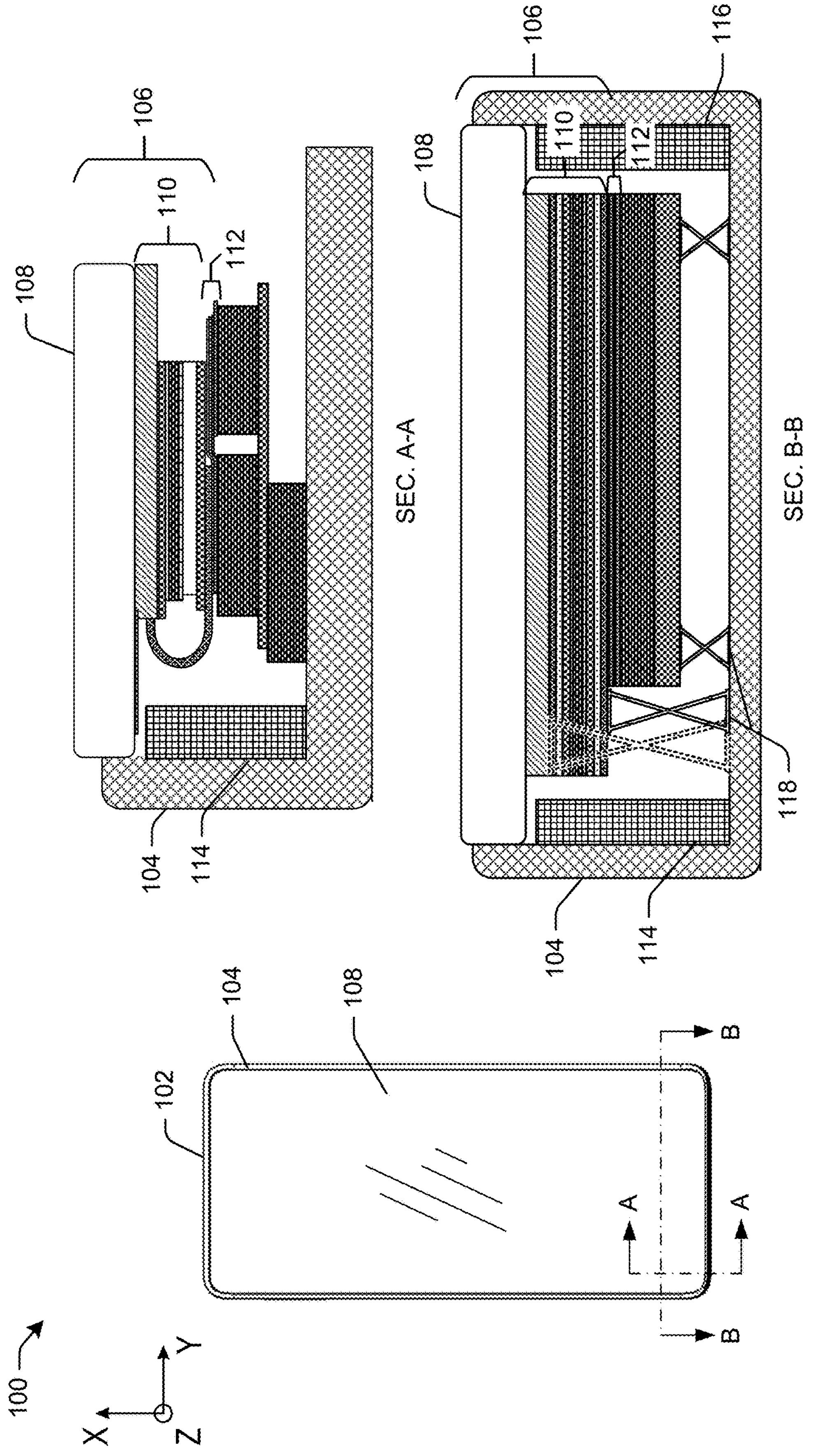
FIG. 1 illustrates a first example implementation of an example electronic device having a grounding architecture.

FIG. 1 illustrates a first example implementation 100 of an example electronic device 102 having a grounding architecture in accordance with one or more implementations. As illustrated, the example electronic device 102 includes a housing 104 (e.g., a frame) and a display 106. The display 106 includes a cover glass 108 and a display panel module 110. The cover glass 108 has an exterior face and an opposing interior face and the display panel module 110 has a first surface and an opposing second surface. As illustrated in cross-sectional view A-A, the interior face of the cover glass 108 is attached to the first surface of the display panel module 110. The cover glass 108 and the display panel module 110 may be attached through an adhesive layer. The electronic device 102 also includes a grounding architecture 112. The grounding architecture 112 may be attached to the second surface of the display panel module 110 through an adhesive.

The display 106 may further include one or more of a touch layer (e.g., touch sensor panel), a polarizer layer (e.g., polarization filters), an adhesive layer, and/or a protective layer. The protective layer may include one or more sublayers, such as a polymer sublayer (e.g., polyethylene terephthalate (PET) substrate, polyimide (PI), polycarbonate (PC), carbon fiber), a metallic sublayer (e.g., copper, stainless steel, titanium), a foam pad (e.g., to absorb compressive forces during manufacturing or usage), and an adhesive sublayer. The protective layer can shield the display panel module 110 from mechanical and electromagnetic forces, as well as from thermal radiation.

The example electronic device 102 may also include a first antenna 114 and a second antenna 116. As illustrated in cross-sectional view B-B, the first antenna 114 and the second antenna 116 are disposed adjacent to grounding elements 118. The grounding elements 118 may provide an isolated grounding path for the first antenna 114 and the second antenna 116. For example, the grounding elements 118 may be grounding springs, fabric-over-foam (FoF), conductive fabric, and the like. In such a configuration, isolation within the example electronic device 102 can be improved while the risk of cavities is reduced, and the first antenna 114 and second antenna 116 sensitivity degradation can be reduced while maintaining radiation performance.

Figure 2:
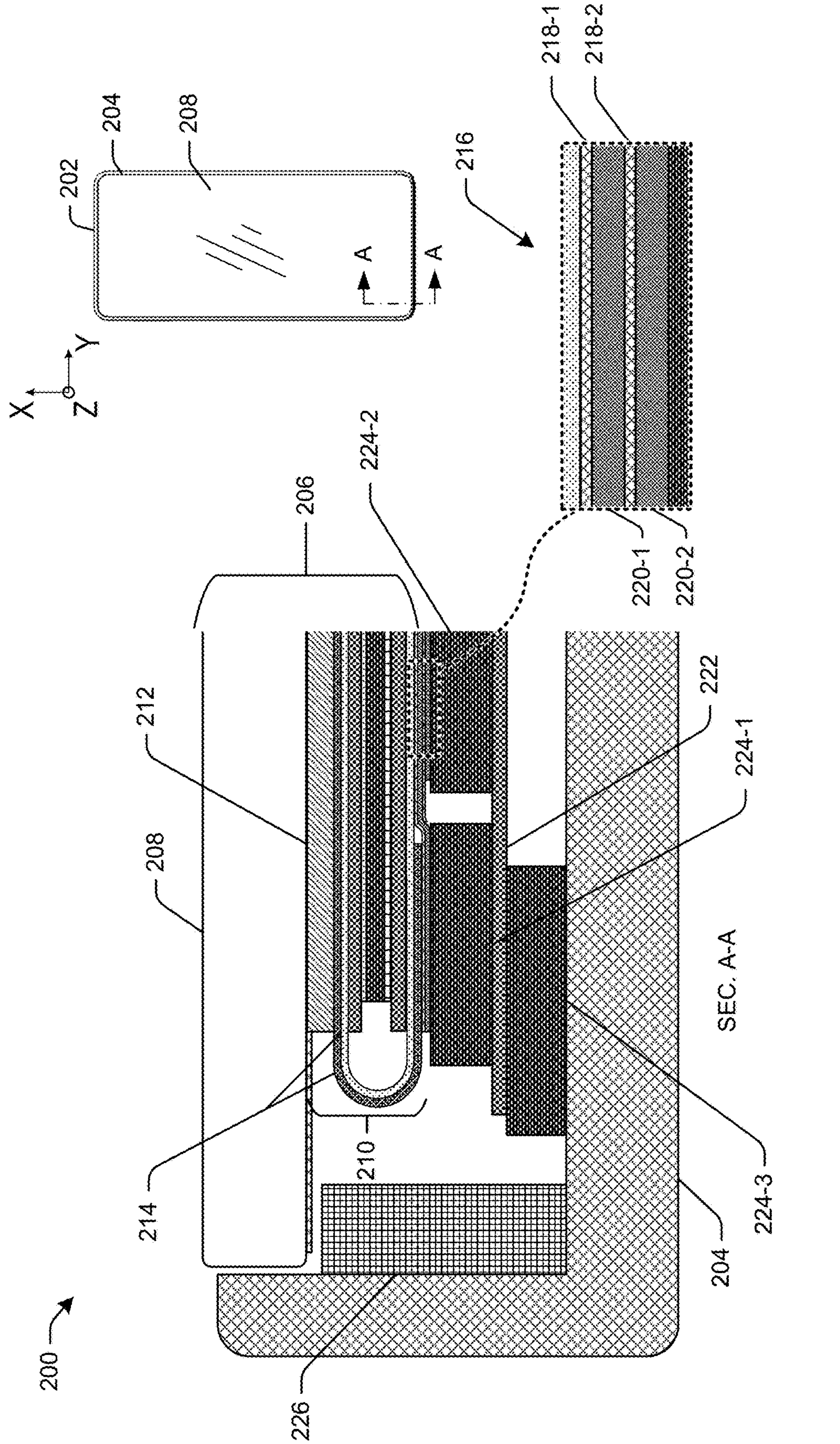
FIG. 2 illustrates a second example implementation of an example electronic device having a grounding architecture.

FIG. 2 illustrates a second example implementation 200 of an example electronic device 202 having a grounding architecture in accordance with one or more implementations. The example electronic device 202 includes a housing 204 (e.g., the housing 104) and a display 206 (e.g., the display 106) having a cover glass 208 (e.g., the cover glass 108) and a display panel module 210 (e.g., the display panel module 110). The cover glass 208 has an exterior face and an opposing interior face and the display panel module 210 has a first surface and an opposing second surface. In implementations, the first surface of the display panel module 210 may be a metal panel backing 212 and may be attached (e.g., optically bonded) to the interior face of the cover glass 208. The second surface of the display panel module 210 may be a display flex 214. The display flex 214 can include a flexible circuit board, a rigid circuit board, a chip on flex subassembly, a panel tail, or any combination of these. As illustrated in FIG. 2, the display flex 214 is curved and adheres to the metal panel backing 212. In aspects, the display flex 214 may be grounded to the metal panel backing 212.

FIG. 2 further illustrates a grounding architecture 216 (e.g., the grounding architecture 112) which includes a first insulating layer 218-1 attached to the second surface (e.g., the display flex 214) of the display panel module 210. In implementations, the first insulating layer 218-1 may be grounded (e.g., operatively coupled) to the display flex 214. The first insulating layer 218-1 may further include selective openings to enable direct ground contact between the display flex 214 and a first copper tape layer 220-1. The first copper tape layer 220-1 may act as a shield and/or may protect the display flex 214 from electromagnetic interference (EMI). The grounding architecture 216 further includes a second insulating layer 218-2 and a second copper tape layer 220-2.

The insulating layers 218 may be thinner than the copper tape layers 220. By using thin insulating layers 218 between the two copper tape layers 220, the two copper tape layers 220 may act as a capacitor, thereby enabling the copper tape layers 220 to store electrical charges within the electronic device 202 that may affect antenna performance. By reducing the thickness of the insulating layers 218, the two copper tape layers 220 can act as a stronger capacitor, which may enable frequency selectivity. For example, the grounding architecture 216 may be isolated at lower frequencies and grounded (operatively coupled) at higher frequencies.

The two copper tape layers 220 may be composed of copper material and a conductive adhesive. In some implementations, the two copper tape layers 220 may include any conductive metal material and a conductive adhesive. The two insulating layers 218 may be composed of an insulator and an adhesive. In some implementations, the adhesive in the two insulating layers 218 may be a conductive adhesive and/or a pressure sensitive adhesive.

Further, a metal trim layer 222 may be positioned below the two insulating layers 218 and the two copper tape layers 220. The metal trim layer 222 may be adhered to the first copper tape layer 220-1 with a first adhesive 224-1. In implementations, the metal trim layer 222 may be adhered to the second copper tape layer 220-2 with a second adhesive 224-2. The metal trim layer 222 may be adhered to the housing 204 with a third adhesive 224-3. The adhesives 224 may be pressure sensitive adhesives (PSAs), polyurethane-reactive (PUR) adhesives, or conductive PSAs (CPSAs). As an example, the first adhesive 224-1 may be a PUR adhesive, the second adhesive 224-2 may be a CPSA, and the third adhesive 224-3 may be a PSA. In aspects, the metal trim layer 222 may be positioned near a first antenna 226. In implementations, the metal trim layer 222 may be grounded (operatively coupled) to the copper tape layers 220 and the display flex 214, acting as a reference grounding point for the first antenna 226.

In implementations, the metal panel backing 212 may further provide enhanced shielding within the electronic device 202 to block external and internal EMI. The electromagnetic properties of the metal within the metal panel backing 212 may reduce EMI and enhance signal propagation of the first antenna 226. By reducing EMI, the signal-to-noise ratio (SNR) (e.g., the ratio of the desired signal strength to the background noise or interference) is improved, thus enhancing signal quality and propagation for the first antenna 226.

Figure 3:
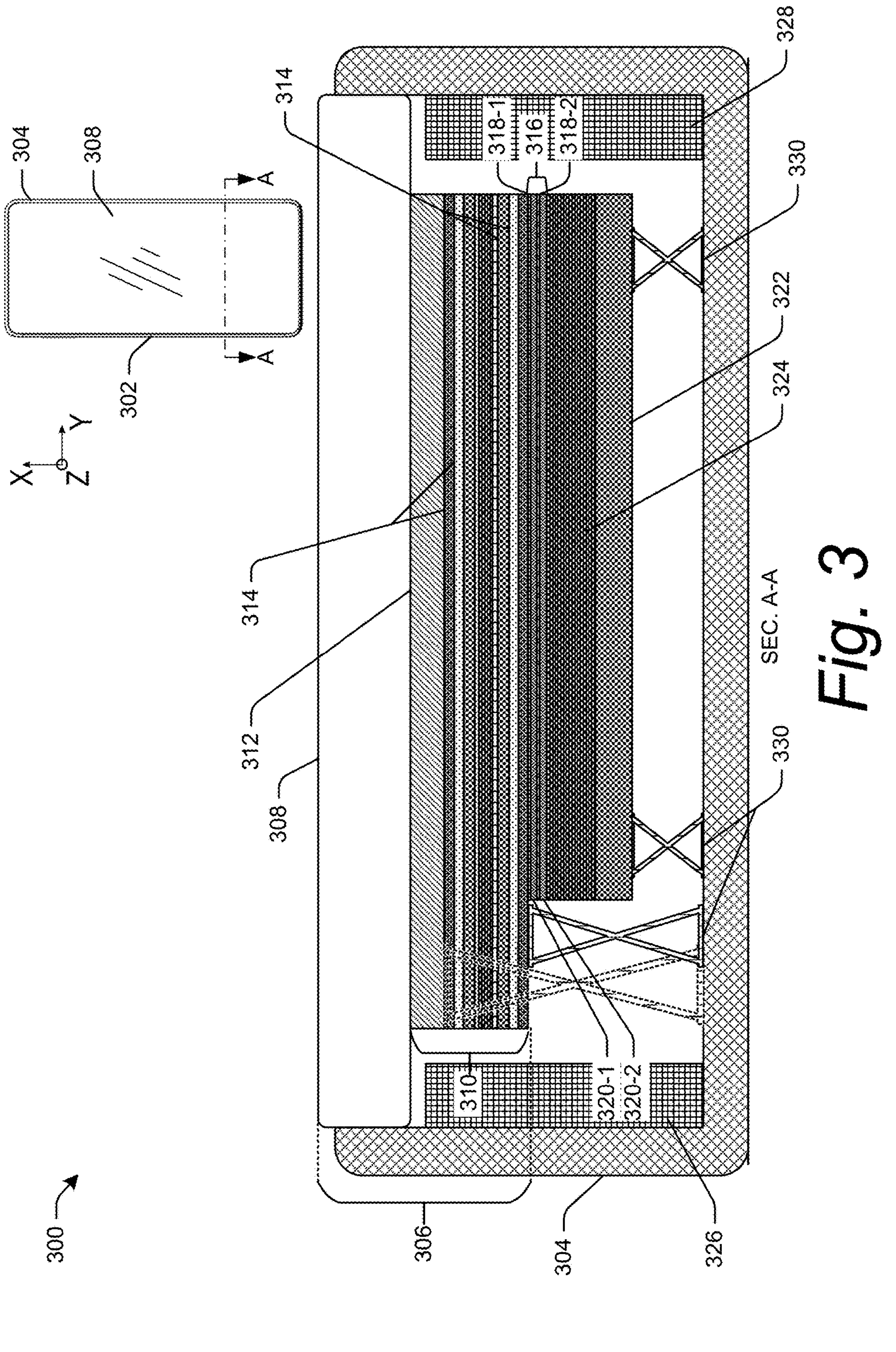
FIG. 3 illustrates a third example implementation of an example electronic device having a grounding architecture.

FIG. 3 illustrates a third example implementation 300 of the example electronic device 302 having a grounding architecture in accordance with one or more implementations. The example electronic device 302 further includes a second antenna 328 and a plurality of grounding elements 330. As illustrated in FIG. 3, the metal panel backing 312 is positioned near the second antenna 328. The plurality of grounding elements 330 may be positioned near the first antenna 326 and the second antenna 328. The metal trim layer 322 may be electrically connected to the metal panel backing 312 through at least one of the plurality of grounding elements 330. In implementations, the metal trim layer 322 may act as a common reference grounding point for the first antenna 326 and the second antenna 328. In further implementations, the metal panel backing 312 may act as a common reference grounding point for a third and fourth antenna (not illustrated).

In aspects, the grounding architecture 316 may create an isolated grounding path within the electronic device 302 which can reduce the impact of noise or interference from electronic components (e.g., capacitors, power supplies, camera modules, display modules, sensors, central processing units (CPUs)) and may lead to improvement of the quality of signals from the first antenna 326 and the second antenna 328. The isolated grounding path from the grounding architecture 316 may also lead to improvements in the connectivity of the first antenna 326 and the second antenna 328 because EMI and electronic noise are reduced. For example, a user may have a smartphone (e.g., the electronic device 302) with a grounding architecture (e.g., the grounding architecture 316) within an enclosure (e.g., the housing 304, the display 306, the cover glass 308, and the display panel module 310). Because of the benefits of the grounding architecture, the user may have more stable communication services and fewer dropped connections that enhance their overall user experience with their smartphone.

In aspects, the metal trim layer 322 is positioned below the two insulating layers 318 and the two copper tape layers 320 and may be adhered to the second copper tape layer 320-2 with the adhesive 324. Because of the connection to the second copper tape layer 320-2 (and each preceding layer's connections), the metal trim layer 322 may be capacitively coupled (e.g., not directly connected) to the first copper tape layer 320-1 as well as to the display flex 314. If the metal trim layer 322 were to directly connect to the display flex 314, the first antenna 326 performance and the second antenna 328 performance may improve due to having a common reference grounding point, but as the cost of the desense due to being contaminated with noise from the first copper tape layer 320-1. If the metal trim layer 322 was not connected to the display flex 314 at all, the desense of the first antenna 326 and the second antenna 328 may improve, but at the cost of the antenna performance due to a cavity created by a gap between the display flex 314 and the metal trim layer 322. To overcome this issue, the capacitive coupling between the metal trim layer 322 and the first copper tape layer 320-1 may create a high frequency short circuit (as opposed to a low frequency open circuit).

Capacitive coupling between two metals (e.g., the first copper tape layer 320-1 and the metal trim layer 322) may avoid problems associated with direct coupling between metals, like corrosion or wear, which may lead to performance degradation over time. Capacitive coupling within the grounding architecture 316 does not involve a direct physical connection and instead has an electrical connection which may have improved reliability in environments with high levels of vibration (e.g., inside a smartphone) and may provide more consistent electrical performance within the electronic device 302. Improved reliability and consistency of the electrical connection between the first copper tape layer 320-1 and the metal trim layer 322 may reduce the risk of degradation of the first antenna 326 and the second antenna 328, thereby mitigating antenna desense.

Figure 4:
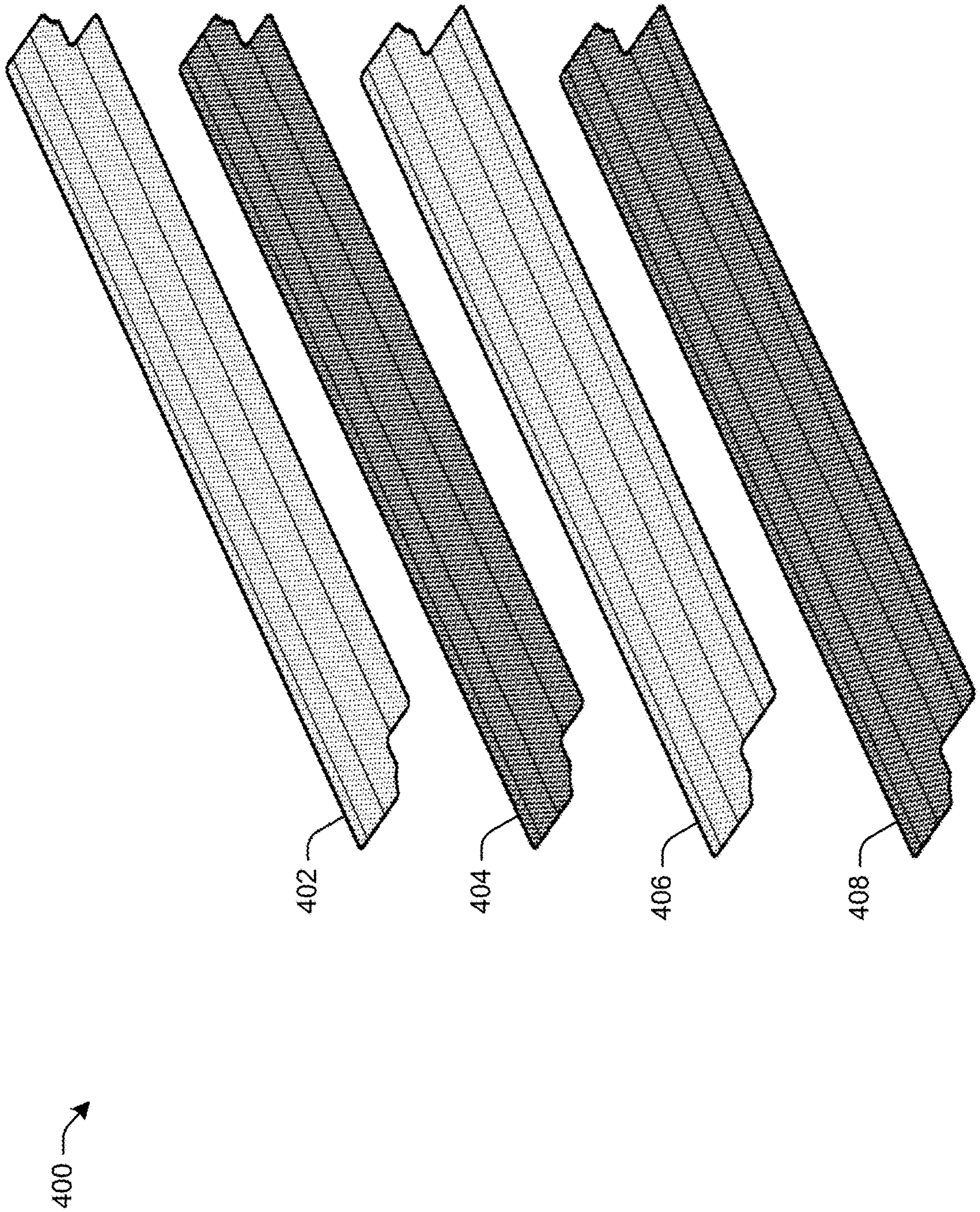
FIG. 4 illustrates an exploded view of a portion of a grounding architecture in accordance with this disclosure.

FIG. 4 is an exploded view of a portion 400 of a grounding architecture within an example electronic device (e.g., example electronic device 102, example electronic device 202, example electronic device 302). FIG. 4 illustrates a first insulating layer 402, a first copper tape layer 404, a second insulating layer 406, and a second copper tape layer 408. In some implementations, the first insulating layer 402 may have the same surface area as the first copper tape layer 404. Additionally, the first copper tape layer 404 may be thicker than the first insulating layer 402. In further implementations, the second insulating layer 406 may have the same surface area as the second copper tape layer 408. The second copper tape layer 408 may be thicker than the second insulating layer 406.

As illustrated in FIG. 4, the first insulating layer 402 has a smaller surface area than the second insulating layer 406 and the first copper tape layer 404 has a smaller surface area than the second copper tape layer 408. In implementations, the first copper tape layer 404 and the second copper tape layer 408 may be composed of copper material and a conductive adhesive. The first insulating layer 402 and the second insulating layer 406 may be composed of an insulator and an adhesive. In some implementations, the adhesive in the first insulating layer 402 and the second insulating layer 406 may be a conductive adhesive, a nonconductive adhesive, and/or a pressure sensitive adhesive.

Figure 5:
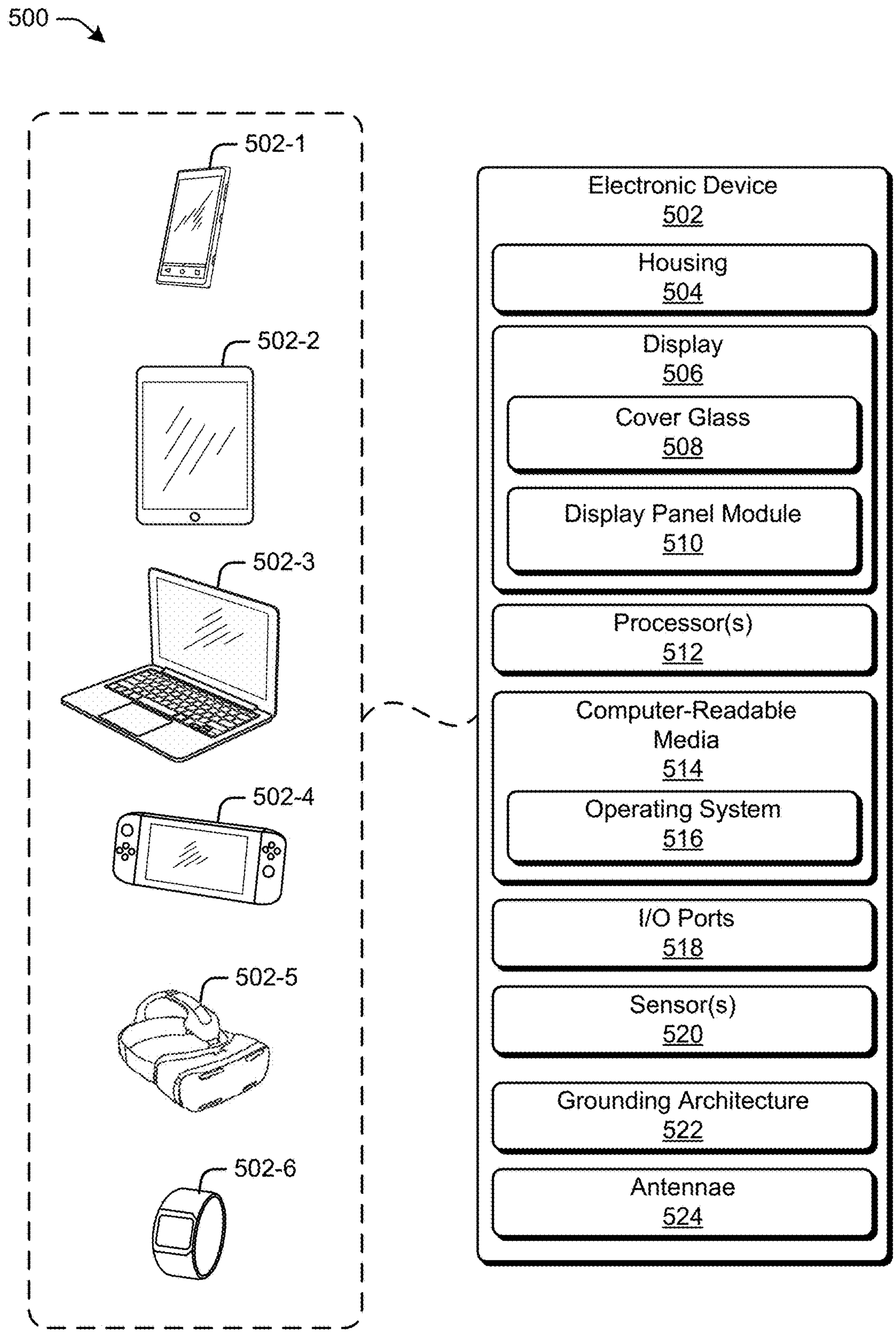
FIG. 5 illustrates an example device diagram of an example electronic device in which grounding architectures can be implemented in accordance with this disclosure.

FIG. 5 illustrates an example device diagram of an example electronic device 502 (e.g., example electronic device 102, example electronic device 202, example electronic device 302) in which grounding architectures can be implemented. The electronic device 502 may include additional components and interfaces omitted from FIG. 5 for the sake of clarity.

The electronic device 502 can be any of a variety of consumer electronic devices. As non-limiting examples, the electronic device 502 can be a mobile phone 502-1, a tablet device 502-2, a laptop computer 502-3, a portable video game console 502-4, virtual-reality (VR) goggles 502-5, a computerized watch 502-6, and the like.

The electronic device 502 includes a housing 504 (e.g., the housing 204) and a display 506 (e.g., the display 206) which define at least one internal cavity within which one or more of a plurality of electronic components may be disposed. In implementations, a mechanical frame may define one or more portions of the housing 504. As an example, a mechanical frame can include plastic or metallic walls that define portions of the housing 504. In additional implementations, a mechanical frame may support one or more portions of the housing 504. As an example, one or more exterior housing components (e.g., plastic panels) can be attached to the mechanical frame (e.g., a chassis). In so doing, the mechanical frame may physically support the one or more exterior housing components, which define portions of the housing 504. In implementations, the mechanical frame and/or the exterior housing components may be composed of crystalline or non-crystalline (e.g., metals, plastics) inorganic solids.

The display 506 may include a cover glass 508 (e.g., the cover glass 208) and a display panel module 510 (e.g., the display panel module 210). The cover glass 508 may be composed of a variety of transparent materials including polymers (e.g., plastic, acrylic), glass (e.g., tempered glass, ceramic glass, sapphire), and so forth, forming a three-dimensional shape. For example, the display 506 may be implemented as a plastic organic light-emitting diode (POLED) or as a glass organic light-emitting diode (GOLED). During manufacturing, a bottom face of the cover glass 508 may be bonded (e.g., glued) to the display panel module 510 to protect the display panel module 510 as well as to serve as a barrier to ingress contaminants (e.g., dust, water). The display 506 can include any suitable touch-sensitive display device, such as a touchscreen, a liquid crystal display (LCD), a thin-film transistor (TFT) LCD, an in-place switching (IPS) LCD, a capacitive touchscreen display, an organic light-emitting diode (OLED) display, an active-matrix organic light-emitting diode (AMOLED) display, a super AMOLED display, and so forth. The display 506 may be referred to as a display or a screen, such that digital content may be displayed on-screen.

The display panel module 510 may include a two-dimensional pixel array forming a grid, operably coupled to one or more row-line drivers via electrical traces. The pixel array generates light to create an image on the display 506 upon electrical activation by one or more drivers. As an example, data-line drivers provide voltage data via electrical traces to the pixel array to control a luminance of individual pixels. A section (e.g., a surface) of the display panel module 510 (e.g., a bottom section) may include more circuitry, such as electrical traces and drivers, than other portions of the display panel module 510 (e.g., a top section, a side section). In such a configuration, the display panel module 510 can be configured such that the section having more circuitry is folded or bent in a direction opposite to the cover glass 508. As a result, the display panel module 510 may include a display flex and/or a chip on flex subassembly (e.g., the display flex 214) (not illustrated in FIG. 5).

The electronic device 502 may further include one or more processors 512. The processor(s) 512 can include, as non-limiting examples, a system on a chip (SoC), an application processor (AP), a central processing unit (CPU), or a graphics processing unit (GPU). The processor(s) 512 generally executes commands and processes utilized by the electronic device 502 and an operating system installed thereon. For example, the processor(s) 512 may perform operations to display graphics of the electronic device 502 on the display 506 and can perform other specific computational tasks.

The electronic device 502 may also include computer-readable storage media (CRM) 514. The CRM 514 may be a suitable storage device configured to store device data of the electronic device 502, user data, and multimedia data. The CRM 514 may store an operating system 516 that generally manages hardware and software resources (e.g., the applications) of the electronic device 502 and provides common services for applications stored on the CRM 514. The operating system 516 and the applications are generally executable by the processor(s) 512 to enable communications and user interaction with the electronic device 502. One or more processor(s) 512, such as a GPU, perform operations to display graphics of the electronic device 502 on the display 506 and can perform other specific computational tasks. The processor(s) 512 can be single-core or multiple-core processors.

The electronic device 502 may also include input/output (I/O) ports 518. The I/O ports 518 allow the electronic device 502 to interact with other devices or users. The I/O ports 518 may include any combination of internal or external ports, such as universal serial bus (USB) ports, audio ports, Serial ATA (SATA) ports, peripheral component interconnect express (PCIe) based ports or card-slots, secure digital input/output (SDIO) slots, and/or other legacy ports.

The electronic device 502 may further include one or more sensors 520. The sensor(s) 520 can include any of a variety of sensors, such as an audio sensor (e.g., a microphone), a touch-input sensor (e.g., a touchscreen), an image-capture device (e.g., a camera, video-camera), proximity sensors (e.g., capacitive sensors), an under-display fingerprint sensor, or an ambient light sensor (e.g., photodetector). In implementations, the electronic device 502 includes one or more of a front-facing sensor(s) and a rear-facing sensor (s).

The electronic device 502 may also include a grounding architecture 522 (e.g., the grounding architecture 216) configured to reduce EMI and improve desense in antennae 524 (e.g., the first antenna 326 and the second antenna 328). The grounding architecture 522 may utilize capacitive coupling to enhance EMI shielding and improve signal connectivity for the antennae 524.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

CONCLUSION

Although aspects of a grounding architecture within an electronic device directed at improving isolation for enhanced antenna desensitization have been described in language specific to techniques, systems, and/or apparatuses, it is to be understood that the subject of the appended claims is not necessarily limited to the specific techniques, systems, and/or apparatuses described. Rather, the specific techniques, systems, and apparatuses are disclosed as example implementations of the techniques, systems, and/or apparatuses for a grounding architecture within an electronic device directed at improving isolation for enhanced antenna desensitization. Further, various different aspects are described, and it is to be appreciated that each described aspect can be implemented independently or in connection with one or more other described aspects.

What is claimed is:

1. An electronic device comprising:
- a housing;
- a display attached to the housing, the housing and the display configured to define an internal cavity within which one or more electronic components are disposed, the display comprising:
  - a cover glass having an exterior face and an opposing interior face; and
  - a display panel module having a first surface and an opposing second surface, the first surface of the display panel module attached to the interior face of the cover glass;
- a first antenna and a second antenna disposed at least partially within the internal cavity, the first antenna and the second antenna disposed adjacent to a plurality of grounding elements effective to provide an isolated grounding path; and
- a grounding architecture positioned within the internal cavity, the grounding architecture comprising:
  - a first insulating layer attached to the second surface of the display panel module;
  - a first copper tape layer attached to the first insulating layer;
  - a second insulating layer attached to the first copper tape layer;
  - a second copper tape layer attached to the second insulating layer; and
  - a metal trim layer attached to the second copper tape layer, the metal trim layer configured to be electrically coupled to at least one of the plurality of grounding elements.

2. The electronic device of claim 1, wherein the first surface of the display panel module is a metal panel backing.

3. The electronic device of claim 2, wherein the metal panel backing is electrically coupled to at least one of the plurality of grounding elements.

4. The electronic device of claim 1, wherein the second surface of the display panel module is a display flex, the display flex configured to be grounded to the first surface of the display panel module.

5. The electronic device of claim 1, wherein the isolated grounding path is configured to electrically ground the first antenna and the second antenna.

6. The electronic device of claim 1, wherein the first copper tape layer and the second copper tape layer comprise a conductive metal and a conductive adhesive.

7. The electronic device of claim 6, wherein the conductive metal is any one of copper, stainless steel, aluminum, titanium or graphite.

8. The electronic device of claim 1, wherein the first insulating layer and the second insulating layer comprise an insulator and an adhesive.

9. The electronic device of claim 1, wherein the second copper tape layer and the second insulating layer have a larger surface area than the first copper tape layer and the first insulating layer.

10. The electronic device of claim 1, wherein the metal trim layer is configured to act as a reference grounding point for the first antenna and the second antenna.

11. The electronic device of claim 1, wherein the metal trim layer is not electrically connected to at least one of the second surface of the display panel module or the first copper tape layer.

* * * * *